United States Patent

Francisco

Patent Number: 6,122,491
Date of Patent: *Sep. 19, 2000

[54] COMMUNICATIONS SYSTEM USING POWER AMPLIFIER WITH DYNAMIC BIASING

[75] Inventor: Mark Francisco, Millstone Township, Monmouth County, N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/777,311

[22] Filed: Dec. 27, 1996

[51] Int. Cl.$^7$ .................................................. H04B 1/04
[52] U.S. Cl. ........................ 455/127; 455/69; 455/126; 455/522; 330/134; 330/285
[58] Field of Search .................... 455/69, 127, 126, 455/115, 116, 117, 522; 330/136, 285, 296, 134

[56] References Cited

U.S. PATENT DOCUMENTS

| | | | |
|---|---|---|---|
| 5,136,257 | 8/1992 | Reading | 330/129 |
| 5,212,823 | 5/1993 | Fujii et al. | 455/522 |
| 5,420,536 | 5/1995 | Faulkner et al. | 330/149 |
| 5,452,473 | 9/1995 | Weiland et al. | 455/88 |
| 5,455,968 | 10/1995 | Pham | 455/127 |

*Primary Examiner*—Lee Nguyen

[57] ABSTRACT

In a communications system, a power amplifier is dynamically biased in response to a control signal indicative of the required transmission power. In delivering relatively high transmission power, the DC operating point of an amplifying element in the power amplifier is placed far from the cutoff and saturation regions of the output characteristics of the amplifying element. As a result, the corresponding input signal at a high drive level to the power amplifier is virtually undistorted thereby and, at the same time, a high power efficiency is achieved. In delivering relatively low transmission power, although the DC operating point is placed relatively close to the cutoff region of the output characteristics of the amplifying element, because of the corresponding input signal which is at a low drive level, the power amplifier minimally distorts the input signal. However, a high power efficiency is maintained because the input DC power to the power amplifier is reduced as well as the transmission power.

23 Claims, 3 Drawing Sheets

100

COMMUNICATIONS SYSTEM USING POWER AMPLIFIER WITH DYNAMIC BIASING

FIELD OF THE INVENTION

The invention relates to communications systems, and more particularly to a communications system using a power amplifier with a biasing circuit.

BACKGROUND OF THE INVENTION

It is well-known that when an amplifying element such as a transistor is employed in an amplifier circuit, biasing is necessary to establish an appropriate operating point for the amplifying element. With no excitation applied to the element, the operating point is defined in an active region of the output characteristics thereof. This operating point is frequently referred to as the "Quiescent (Q) Point" or the "Direct Current (DC) Operating Point".

To provide linear amplification for a radio-frequency (RF) input signal for example, a class A amplifier is normally used, wherein the DC operating point of an amplifying element is placed far enough from the cutoff and saturation regions in its output characteristics. This ensures that the anticipated input signal excursions to either side of the operating point do not cause the amplifying element to cut off the signal or become saturated, thus avoiding distortions in the amplifier output. However, a major drawback of the class A amplifier is its low power efficiency due to a relatively high DC input power required by the amplifier, with respect to its output signal power. In addition, as the input power to the class A amplifier is reduced or backed off from the maximum input power, the amount of current drawn by the amplifier quickly approaches that of the high quiescent current, without significantly reducing its power consumption. In some cases, the current draw can actually increase as the input power is backed off, resulting in no reduction in power consumption.

A class B amplifier has its amplifying element biased to cut off a half-cycle of an input signal, with an output current flow only during the positive half-cycle of the signal. As a result, the amplifier output is significantly distorted. Thus, a class B amplifier is unsuitable for a linear operation. However, with respect to a class A amplifier, a class B amplifier affords a higher power efficiency as the DC input power to the amplifier is relatively low.

A class A-B amplifier, on the other hand, has its amplifying element biased such that the output current flows for more than half of the cycle of the input signal. As a result, a class A-B amplifier behaves like a hybrid between class A and class B amplifiers. Thus, a class A-B amplifier causes a lower distortion than a class B amplifier (but a higher distortion than a class A amplifier) to an input signal at a high drive level. At the same time, the class A-B amplifier realizes a higher reduction of power consumption than a class A amplifier (but a lower reduction than a class B amplifier) during an input power backoff.

An amplifier circuit can also have its amplifying element biased dynamically. One such amplifier circuit is disclosed in U.S. Pat. No. 5,136,257 issued to Reading. The disclosed amplifier circuit is an RF power amplifier having three amplifying elements. The amplifier has a control circuit providing a feedback signal to a biasing circuit for dynamically varying the operating points of the amplifying elements. The feedback signal represents the difference between a level control voltage and the amplifier output. However, like other circuits involving a feedback, the Reading amplifier is susceptible to instability of the feedback loop, and is required to have a considerable tolerance of feedback accuracy. In addition, the Reading amplifier does not provide linear amplification over a broad output range.

The above prior art amplifier circuits are not desirable for use in many digital communications systems including digital cellular telephones. For example, a digital cellular telephone using a standard code division multiple access (CDMA) scheme is required to provide an output power range of more than 74 dB. Furthermore, the digital modulation pursuant to the CDMA scheme calls for linear amplification. For details on the CDMA scheme, one may refer to: J. White, "What is CDMA?", *Applied Microwave & Wireless*, Fall 1993, pp. 5, 6 & 8. Moreover, even though a cellular telephone usually operates at a low output power level (i.e., a large backoff from the maximum required output), the power efficiency has to be high because the cellular telephone is normally powered by a battery having a limited capacity, which accordingly affords a limited transmission time.

In view of the foregoing, there exists a need to improve the prior art amplifier circuits for use in communications systems, in particular, the digital cellular telephones, to achieve linear amplification over a broad output power range and, at the same time, a high power efficiency.

SUMMARY OF THE INVENTION

The invention overcomes the prior art limitations by dynamically biasing an amplifying element in an amplifier circuit based on an amount of power to be used to transmit information. A control signal indicative of the amount of the required transmission power is provided to a biasing circuit. The latter generates a signal to dynamically bias the amplifying element, with the signal level being a function of the required transmission power amount.

In accordance with the inventive dynamic biasing approach, when the amplifier circuit delivers relatively high transmission power, the DC operating point of the amplifying element is placed far from the cutoff and saturation regions of the output characteristics thereof. As a result, the corresponding input signal at a high drive level to amplifier circuit is virtually undistorted thereby and, at the same time, a high power efficiency is achieved. In delivering relatively low transmission power, although the DC operating point is placed relatively close to the cutoff region of the output characteristics of the amplifying element, because of the corresponding input signal which is at a low drive level, the amplifier circuit minimally distorts the input signal. However, a high power efficiency is maintained because the input DC power to the amplifier circuit is reduced as well as the transmission power.

DETAILED DESCRIPTION

Figure 1:
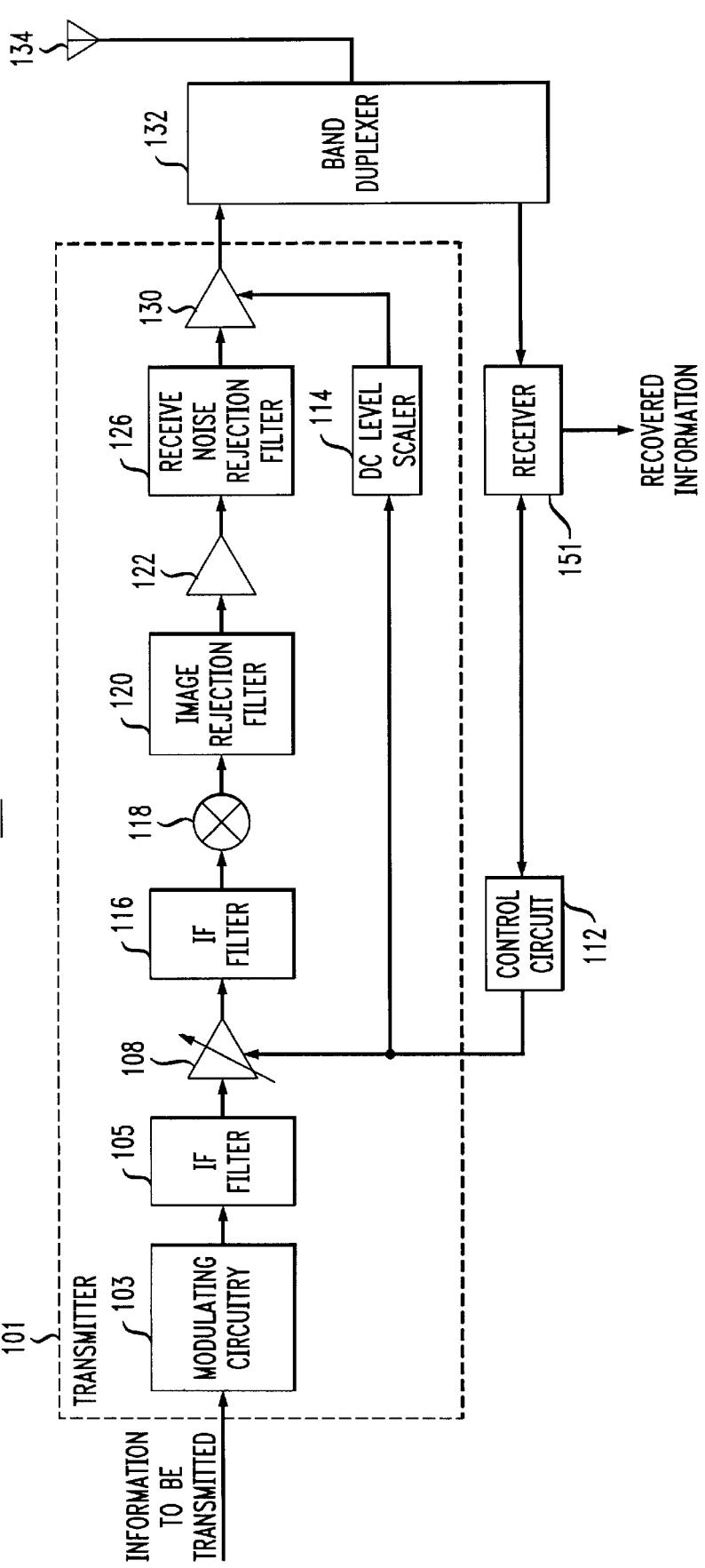
FIG. 1 illustrates a communications system, more specifically, a digital cellular telephone in accordance with the invention.

FIG. 1 illustrates communications system 100 embodying the principles of the invention. In this illustrative embodiment, system 100 is a portable cellular telephone for wireless communications over designated frequency bands pursuant to the advanced mobile phone system (AMPS) cellular standard.

Figure 2:
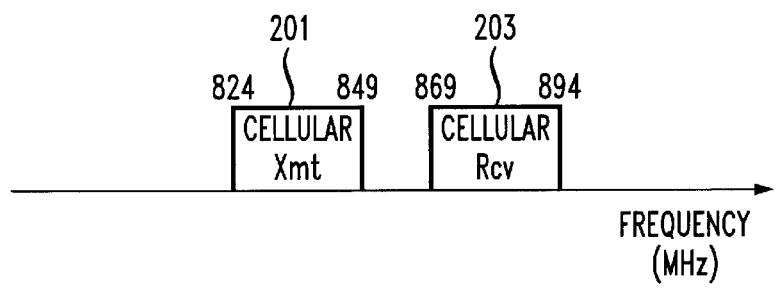
FIG. 2 illustrates cellular transmit and receive bands in the frequency spectrum.

FIG. 2 illustrates the designated cellular bands comprising transmit (Xmt) band 201 and receive (Rcv) band 203 in the frequency spectrum. Specifically, band 201 ranging from 824 MHz to 849 MHz is assigned for transmission by system 100 of cellular communication signals to a remote base station (not shown), where the signals are processed and directed to an intended receiver in a conventional manner. To realize duplex wireless communications, band 203 ranging from 869 MHz to 894 MHz is assigned for reception by system 100 of cellular communication signals from the remote base station. The received communications signals came from an originating transmitter (not shown) and have been processed by the remote base station in a conventional manner.

Referring back to FIG. 1, system 100 comprises, inter alia, transmitter 101 in accordance with the invention and receiver 151 of conventional design. A digital signal representing information to be transmitted is fed to modulating circuitry 103 in transmitter 101. In response to the digital signal, circuitry 103 generates a digitally modulated signal in accordance with a standard code division multiple access (CDMA) scheme.

The modulated signal is forwarded to intermediate frequency (IF) filter 105 which is a conventional band-pass filter. Illustratively, the center frequency of filter 105 is 85 MHz and it has a passband of ±600 KHz from the center frequency. Filter 105 is used to eliminate from the modulated signal unwanted signal components outside the passband. The filtered signal is then provided to voltage variable amplifier 108 of conventional design.

It should be pointed out at this juncture that in accordance with a standard wireless communications service, system 100 uses control circuit 112 to listen to pilot signals sent from the remote base station during an idle state. Each pilot signal includes paging information. By processing such information using control circuit 112, system 100 knows, for example, when it is about to receive a message, and how much RF power is required for transmitting a message. The amount of required transmission power varies directly with the current distance between system 100 and the remote base station.

Control circuit 112 sends a power level control signal indicative of the required transmission power amount to voltage variable amplifier 108. In response to the control signal, amplifier 108 imparts a selected gain to the filtered signal to drive power amplifier 130 to deliver the required transmission power. In other words, amplifier 108 controls the drive level of the ultimate input signal to power amplifier 130, under the influence of the control signal.

The structure of power amplifier 130 is fully described hereinbelow. In accordance with the invention, power amplifier 130 is dynamically biased to vary its DC operating point to provide linear amplification over a broad transmission power range. At the same time, it attains a high power efficiency especially when power amplifier 130 operates at low output power levels (i.e., during backoffs from the maximum required output). Advantageously, with the dynamic biasing, the RF signal to be transmitted by system 100 is minimally distorted. In addition, system 100 is powered by a battery having a limited capacity, and thus affords a long transmission time due to the high power efficiency.

To provide the dynamic biasing to power amplifier 130 in accordance with the invention, the power level control signal indicative of the required transmission power amount is also fed to DC level scaler 114. The latter is pre-calibrated to provide a DC voltage input to power amplifier 130 in response to the control signal. The DC voltage level varies with the required transmission power amount to dynamically bias amplifier 130. Accordingly, a DC operating point for amplifier 130 is defined for each specified transmission power amount.

The DC voltage level provided by scaler 114 ranges between a first DC level and a second DC level. The first DC level corresponds to the maximum required transmission power output by amplifier 130. When the DC voltage input to amplifier 130 is at the first DC level, amplifier 130 is biased as a class-A amplifier. With the class A biasing, amplifier 130 would not cut off any part of the anticipated large input signal excursions (corresponding to a high transmission power output) to either side of the DC operating point or become saturated, thus avoiding distortions in the amplifier output. The power efficiency afforded by amplifier 130 is high in this case as the amplifier output power is extremely high despite high DC input power.

The second DC level corresponds to the minimum required transmission power output by amplifier 130. When the DC voltage input to amplifier 130 is at the second DC level, amplifier 130 is biased as a class B amplifier. With the class B biasing, although the DC operating point is placed close to the cutoff region of the output characteristics of amplifier 130, because of the small input signal excursions to either side of the operating point, amplifier 130 minimally cuts off part of the signal. Accordingly, the distortion in the amplifier output is minimal. However, the power efficiency remains high in this case because of the requirement of a low DC input power attributable to the second DC level input.

Thus, by varying the DC level in scaler 114 in response to the power level control signal, in delivering relatively high transmission power, power amplifier 130 is biased as a class A amplifier in anticipation of a relatively high drive level input signal. In delivering medium to relatively low transmission power, power amplifier 130 is biased as a class A-B or even class B amplifier in anticipation of a relatively low drive level input signal. Advantageously, the inventive dynamic biasing approach affords both high output linearity and power efficiency throughout the continuum from low to high transmission power delivery.

The amplified signal from voltage variable amplifier 108 is provided to IF filter 116 similar to filter 105. Filter 116 is used to eliminate from the amplified signal any distributed noise outside the passband of 84.4 MHz to 85.6 MHz. The filtered signal is then fed to mixer 118 where it is frequency-translated into cellular Xmt band 201. The frequency-translated signal is forwarded to image rejection filter 120. Filter 120 is a band-pass filter having a passband of 824 MHz to 849 MHz. It eliminates from the signal unwanted signal components outside cellular Xmt band 201.

The filtered signal is fed to amplifier 122 which is a low power class A amplifier. Amplifier 122 imparts a predetermined gain to the filtered signal to adjust the drive level of the input signal to power amplifier 130. Before the amplified signal is introduced to power amplifier 130, the signal is filtered by receive noise rejection filter 126 similar to filter 120. Filter 126 eliminates from the amplified signal any distributed noise outside cellular Xmt band 201. The filtered signal is then provided to power amplifier 130.

In accordance with the inventive dynamic biasing approach described above, power amplifier 130 delivers a cellular transmit signal having the required transmission power through band duplexer 132. The latter is a standard common junction separating cellular transmit signals from cellular receive signals. Duplexer 132 passes the transmit signal from amplifier 130 to antenna 134, and thence onto cellular Xmt band 201.

In duplex wireless communications, band duplexer 132 receives a cellular receive signal from cellular Rcv band 203 through antenna 134. The received signal is then passed to receiver 151. In a well-known manner, receiver 151 recovers the information represented by the received signal.

Figure 3:
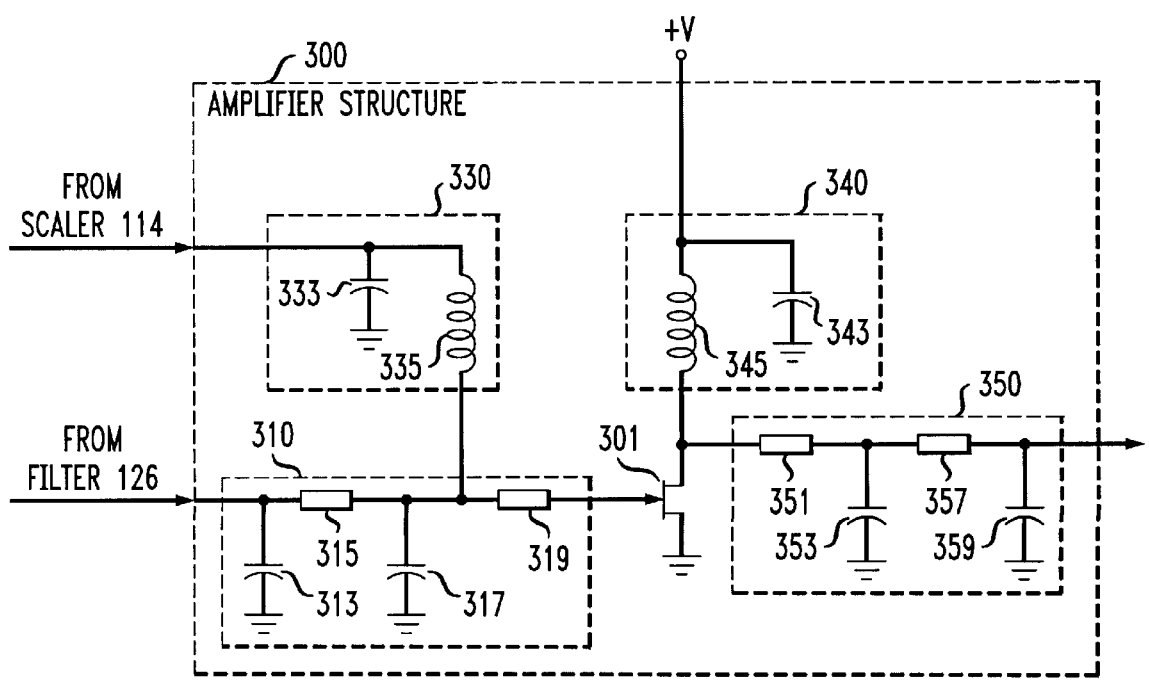
FIG. 3 illustrates a circuit for a power amplifier used in the system of FIG. 1.

The structure of power amplifier 130 will now be described. FIG. 3 illustrates amplifier structure 300 which may be assumed by amplifier 130. Central to structure 300 is field effect transistor (FET) 301. The source terminal of transistor 301 is connected to ground. Its gate terminal is connected to input matching network 310 coupled to gate bias circuit 330. The drain terminal of the transistor is connected to drain bias circuit 340 and also to output matching network 350.

Capacitor 313 in network 310 at one end is connected to ground, and at the other end to an input to structure 300 and transmission line 315. Transmission line 315 connects capacitor 313 to capacitor 317. Capacitor 317 at one end is connected to ground, and at the other end to transmission line 319 and circuit 330, in addition to transmission line 315. Transmission line 319 connects both capacitor 317 and circuit 330 to the gate terminal of transistor 301.

Gate bias circuit 330 comprises capacitor 333 and inductive choke 335. Capacitor 333 is connected at one end to ground, and at the other end to inductive choke 335 and a DC voltage provided by scaler 114 for dynamically biasing amplifier 130 in accordance with the invention. Inductive choke 335 is also connected to capacitor 317 and transmission line 319 in network 310.

Similar to gate bias circuit 330, drain bias circuit 340 comprises capacitor 343 and inductive choke 345. Capacitor 343 at one end is connected to ground, and at the other end to inductive choke 345 and a power source (e.g. a battery) providing a predetermined voltage +V. Inductive choke 345 is also connected to the drain terminal of transistor 301 and output matching network 350.

Transmission line 351 in network 350 connects the drain terminal of transistor 301 to capacitor 353. Capacitor 353 at one end is grounded and at the other end connected to transmission line 357, in addition to transmission line 351. Transmission line 357 is connected, at an output of amplifier structure 300, to capacitor 359 which is grounded at its other end.

Power amplifier 130 pursuant to structure 300 will now be defined. In power amplifier 130, output matching network 350 is synthesized such that the load impedance ($Z_L$) of band duplexer 132 of FIG. 1 presented to transistor 301 over Xmt band 201 is transformed according to the following expression:

$$Z_L = \frac{V_{dd}}{2 * I_{qA}},$$

where $V_{dd}$ represents the drain supply voltage, and $I_{qA}$ represents the quiescent drain current of class-A operation. In a well-known manner, the values of the individual components within network 350 can be readily determined to realize such a transformation. Bias circuit 340 in amplifier 130 is synthesized such that the impedance presented to transistor 301 over band 201 is much greater than the load impedance $Z_L$. Input matching network 310 in amplifier 130 is synthesized such that the source impedance ($Z_S$) presented by receive noise rejection filter 126 over band 201 is transformed according to the following expression:

$$Z_S = Z^*_{input},$$

where $Z^*_{input}$ represents the complex conjugate of the input impedance of transistor 301 when presented with output matching network 350. Again, in a well-known manner, the values of the individual components within network 310 can be readily determined to realize such a transformation. Bias circuit 330 in amplifier 130 is synthesized such that the impedance presented to transistor 301 over band 201 is much greater than the source impedance $Z_S$.

Figure 4:
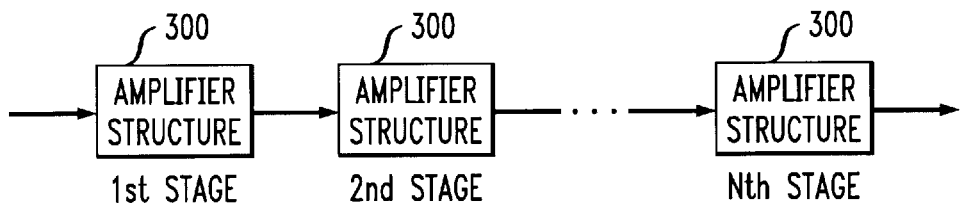
FIG. 4 illustrates an amplifier structure comprising a concatenation of circuits of FIG. 3.

It should be pointed out that the gain afforded by amplifier structure 300 can be increased by repeating the structure in concatenation. Thus, power amplifier 130 may assume general amplifier structure 400 in FIG. 4 having N stages in cascade each comprising structure 300, where N>1. It can be shown that the gain afforded by structure 400 is N times that afforded by structure 300.

Figure 5:
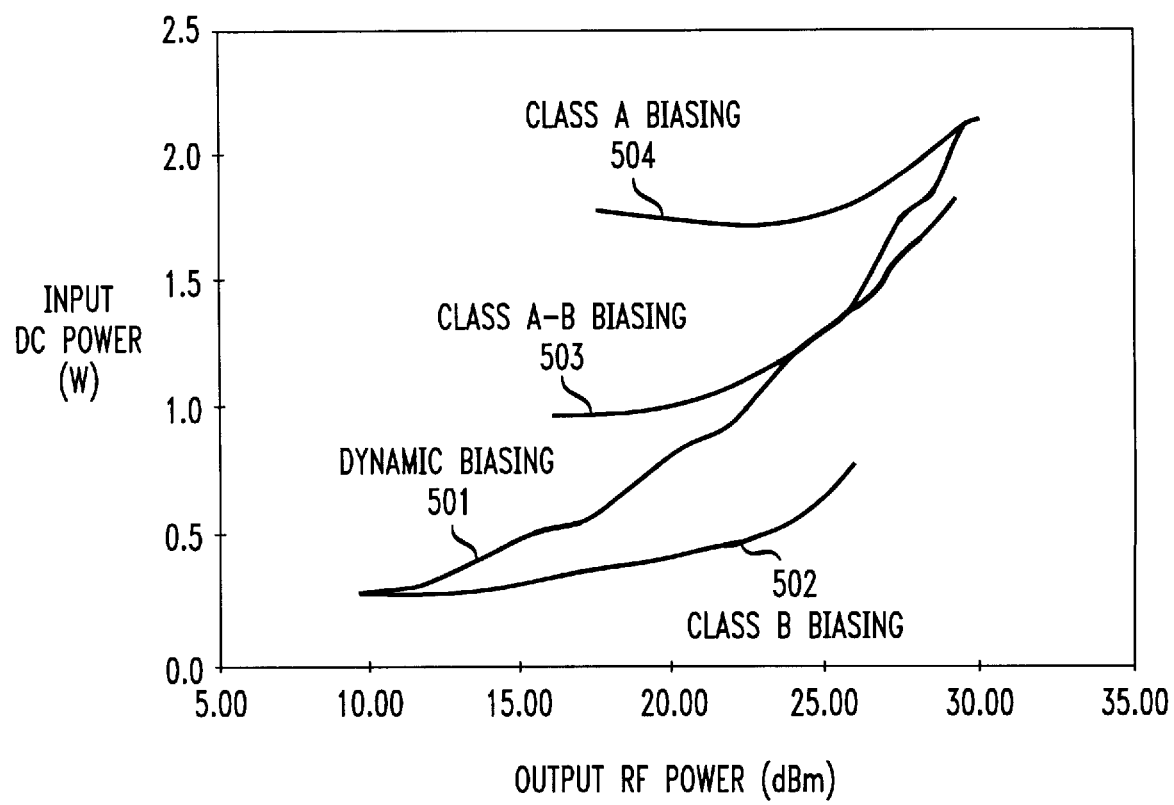
FIG. 5 is a graph depicting the relationship between the input DC power to and the output RF power by the power amplifier when biased dynamically in accordance with the invention, as a class A amplifier, as a class A-B amplifier, and as a class B amplifier.

FIG. 5 is a graph for comparing the power efficiencies of amplifier 130 when biased dynamically in accordance with the invention, strictly as a class-A amplifier, strictly as a class A-B amplifier, and strictly as a class-B amplifier. As shown in FIG. 5, line 501 is a plot of output RF power by amplifier 130 when biased dynamically in accordance with the invention against the input DC power. Line 502 is a plot of output RF power by amplifier 130 when biased strictly as a class B amplifier against the input DC power. Line 503 is a plot of output RF power by amplifier 130 when biased strictly as a class A-B amplifier against the input DC power. Line 504 is a plot of output RF power by amplifier 130 when biased strictly as a class A amplifier against the input DC power.

In this illustrative embodiment, the maximum required RF power by amplifier 130 is 30 dBm. However, in practice, amplifier 130 usually operates at a power backoff of 10 dB or more (i.e., at 20 dBm or lower). By comparing the input DC power incurred by the various biasing techniques in the 15–20 dBm output RF power region, one realizes that an approximately 2 to 1 power consumption reduction is desirably achieved by the inventive dynamic biasing, with respect to the class A-B biasing; and an approximately 3 to 1 power consumption reduction, with respect to the class A biasing.

The foregoing merely illustrates the principles of the invention. It will thus be appreciated that a person skilled in the art will be able to devise numerous communications systems which, although not explicitly shown or described herein, embody the principles of the invention and are thus within its spirit and scope.

For example, the disclosed system is a digital communications system, more specifically, a cellular telephone in accordance with the CDMA digital standard. However, the inventive dynamic biasing approach is also applicable to other digital standards such as North America digital cellular (NADC) standard, personal handy-phone system (PHS) standard, personal handy phone (PHP) standard, etc. It is equally applicable to an analog communications system and, in fact, any system requiring an output power control.

In addition, in the disclosed embodiment, communications system 100 is operative to transmit and receive signals over the cellular communication bands. These communications bands are illustrative and are not intended to be limiting in terms of their number or frequencies. Use of two or more communications bands including, for example, the personal communications system (PCS) frequency bands and industrial, scientific, medical (ISM) frequency bands, in accord with the invention suggests itself to those skilled in the art.

Finally, the amplifying element in the disclosed power amplifier illustratively comprises one or more FETs. It will be appreciated that a person skilled in the art may have the amplifying element comprise one or more bipolar transistors, integrated circuit (IC) amplifiers and such.

I claim:

1. Apparatus for amplifying an input signal representing information for transmission, said apparatus comprising:

an interface for receiving a control signal indicative of an amount of power to be used to transmit the information;

an amplifying element for delivering said amount of power; and a processor responsive to the control signal for generating a biasing signal to adjust the DC operating point of said amplifying element, wherein said biasing signal is a function of said amount of power and is affected by neither the output of said amplifying element nor said input signal.

2. The apparatus of claim 1 further comprising a second amplifying element for adjusting a signal level of said input signal in response to said control signal.

3. The apparatus of claim 1 wherein said amplifying element includes a transistor.

4. The apparatus of claim 3 wherein said transistor is a field effect transistor (FET).

5. The apparatus of claim 1 wherein the signal level of said biasing signal assumes a selected DC voltage.

6. The apparatus of claim 1 wherein said information is transmitted over a cellular communications band.

7. The apparatus of claim 1 wherein said information includes digital data.

8. The apparatus of claim 7 further comprising a modulator for modulating a signal representative of said digital data in accordance with a code division multiple access (CDMA) scheme.

9. A communications system comprising:

a transmitter for transmitting information, which is represented by an input to the system;

a control circuit for generating a control signal indicative of an amount of power to be used to transmit said information, the transmitter including a first amplifier for delivering said amount of power, said first amplifier comprising an amplifying element;

a processor responsive to the control signal for generating a biasing signal to adjust the DC operating point of said amplifying element, said biasing signal being unaffected by said input to the system and the output of said first amplifier, the DC operating point of said amplifying element being determined based on a signal level of said biasing signal; and a second amplifier responsive to the control signal for generating a second signal to drive the first amplifier to deliver said amount of power, said second signal unaffecting an input to said second amplifier.

10. The system of claim 9 wherein said a second amplifier also adjust a signal level of said input in response to said control signal.

11. The system of claim 9 wherein said amplifying element includes a transistor.

12. The system of claim 11 wherein said transistor is an FET.

13. The system of claim 9 wherein the signal level of said biasing signal assumes a selected DC voltage.

14. The system of claim 9 wherein said information is transmitted over a cellular communications band.

15. The system of claim 9 wherein said information includes digital data.

16. The system of claim 15 further comprising a modulator for modulating a signal representative of said digital data in accordance with a CDMA scheme.

17. The system of claim 9 including a cellular telephone.

18. A method for use in a system for communicating information, said system comprising a first amplifier and a second amplifier, said first amplifier including an amplifying element, said method comprising the steps of:

receiving a control signal indicative of an amount of power to be used to transmit said information, which is represented by an input to said system;

delivering said amount of power using said first amplifier;

generating a biasing signal to adjust the DC operating point of said amplifying element in response to said control signal, said biasing signal being unaffected by said input to the system and the output of said first amplifier, the DC operating point of said amplifying element being determined based on a signal level of said biasing signal; and in response to said control signal, generating a second signal using the second amplifier to drive said first amplifier to deliver said amount of power, said second signal unaffecting an input to said second amplifier.

19. The method of claim 18 further comprising the step of recovering said information.

20. The method of claim 18 wherein the signal level of said biasing signal assumes a selected DC voltage.

21. The method of claim 18 wherein said information is transmitted over a cellular communications band.

22. The method of claim 18 wherein said information includes digital data.

23. The method of claim 22 further comprising the step of modulating a signal representative of said digital data in accordance with a CDMA scheme.

* * * * *